US008907405B2

(12) United States Patent
Vega et al.

(10) Patent No.: US 8,907,405 B2
(45) Date of Patent: Dec. 9, 2014

(54) SEMICONDUCTOR STRUCTURES WITH DUAL TRENCH REGIONS AND METHODS OF MANUFACTURING THE SEMICONDUCTOR STRUCTURES

(75) Inventors: Reinaldo A. Vega, Wappingers Falls, NY (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 13/088,663

(22) Filed: Apr. 18, 2011

(65) Prior Publication Data

US 2012/0261771 A1 Oct. 18, 2012

(51) Int. Cl.
*H01L 29/66* (2006.01)
*H01L 21/336* (2006.01)
*H01L 29/78* (2006.01)
*H01L 23/12* (2006.01)
*H01L 21/02* (2006.01)

(52) U.S. Cl.
CPC ...... *H01L 29/66628* (2013.01); *H01L 29/7834* (2013.01); *H01L 23/12* (2013.01); *H01L 29/6653* (2013.01); *H01L 21/02112* (2013.01); *H01L 21/0226* (2013.01)
USPC ........... 257/327; 438/197; 438/240; 438/294; 438/295; 438/299; 438/300; 257/E29.005; 257/E29.02; 257/E29.021; 257/E29.026; 257/E29.027; 257/E29.04

(58) Field of Classification Search
CPC ..................... H01L 29/6653; H01L 21/02112; H01L 21/02263–21/02293; H01L 21/0226; H01L 23/12–23/14; H01L 29/0649–29/0653
USPC ......... 438/294, 295, 296, 299, 300, 197, 240; 257/327, E29.005, E29.02, E29.021, 257/E29.026, E29.027, E29.04
See application file for complete search history.

(56) References Cited

U.S. PATENT DOCUMENTS 5,183,771 A 2/1993 Mitsui et al.
5,714,413 A 2/1998 Brigham et al.
(Continued)

FOREIGN PATENT DOCUMENTS

WO WO 2010032174 A1 * 3/2010

OTHER PUBLICATIONS

Mayuzumi et al., "High-Performance Metal/High-k n- and p-MOSFETs With Top-Cut Dual Stress Liners using Gate-Last Damascene Process on (100) Substrates", IEEE Transactions on Electron Devices, vol. 56, No. 4, Apr. 2009, pp. 620-626.

(Continued)

*Primary Examiner* — Phat X Cao
*Assistant Examiner* — Diana C Vieira
(74) *Attorney, Agent, or Firm* — Yuanmin Cai; Roberts Mlotkowski Safran & Cole, P.C.

(57) ABSTRACT

Semiconductor structures with dual trench regions and methods of manufacturing the semiconductor structures are provided herein. The method includes forming a gate structure on an active region and high-k dielectric material formed in one or more trenches adjacent to the active region. The method further includes forming a sacrificial material over the active region and portions of the high-k dielectric material adjacent sidewalls of the active region. The method further includes removing unprotected portions of the high-k dielectric material, leaving behind a liner of high-k dielectric material on the sidewalls of the active region. The method further includes removing the sacrificial material and forming a raised source and drain region adjacent to sidewalls of the gate structure.

29 Claims, 7 Drawing Sheets

(56) References Cited

U.S. PATENT DOCUMENTS

| | | |
|---|---|---|
| 6,245,620 B1 | 6/2001 | Jang et al. |
| 6,548,357 B2 | 4/2003 | Weybright et al. |
| 7,605,449 B2 | 10/2009 | Liu et al. |
| 7,704,835 B2 | 4/2010 | Singh et al. |
| 7,705,417 B2 | 4/2010 | Oishi |
| 2007/0132056 A1 | 6/2007 | Williams |
| 2008/0277740 A1* | 11/2008 | Tateshita .................. 257/396 |
| 2010/0035390 A1* | 2/2010 | Ding et al. ................ 438/152 |
| 2010/0041202 A1* | 2/2010 | Abadeer et al. ............ 438/384 |
| 2010/0041225 A1* | 2/2010 | Anderson et al. .......... 438/592 |

OTHER PUBLICATIONS

Vega et al., "Comparative Study of FinFET Versus Quasi-Planar HTI MOSFET for Ultimate Scalability", IEEE Transactions on Electron Devices, vol. 57, No. 12, Dec. 2010, pp. 3250-3256.

Vega et al., "Low-Standby-Power Bulk MOSFET Design Using High-k Trench Isolation", IEEE Electron Device Letters, vol. 30, No. 12, Dec. 2009, pp. 1380-1382.

\* cited by examiner

SEMICONDUCTOR STRUCTURES WITH DUAL TRENCH REGIONS AND METHODS OF MANUFACTURING THE SEMICONDUCTOR STRUCTURES

FIELD OF THE INVENTION

The invention relates to semiconductor structures and methods of manufacture and, more particularly, to semiconductor structures with dual trench regions and methods of manufacturing the semiconductor structures.

BACKGROUND

Semiconductor integrated-circuit (IC) manufacturers face growing challenges to reliably produce ever-smaller transistors in order to improve performance and decrease cost. Many issues arise, though, when scaling devices such as, for example, FETs and more particularly MOSFETs (metal-oxide-semiconductor field effect transistors). For example, as MOSFETs are scaled below 100 nm in minimum lateral dimension, size-related performance and manufacturing issues become increasingly significant.

More specifically, short gate lengths in MOSFETs result in relatively large source-to-drain leakage currents. These leakage currents can result in undesirably large static power consumption. To suppress source-to-drain leakage current, it is possible to increase the net dopant concentration in the channel region, increase gate capacitance, and decrease the depths of the source and drain junctions adjacent to the channel. For example, a high net dopant concentration in the channel region confines the drain-induced lateral electric field to the drain region, thereby minimizing the effect of drain bias on the electric potential in the channel region near to the source. By increasing the capacitive coupling between the gate electrode and the channel region, control over the on and off state of the device is maintained by the gate electrode rather than the drain. This allows the gate-induced electric field to more effectively suppress source-to-drain leakage current. Also, by keeping the depths of the source and drain junctions adjacent to the channel shallower than the length of the channel region, sub-surface leakage currents can be suppressed.

Issues still arise with each of these approaches that need to be addressed. For example, decreasing the gate dielectric thickness leads to undesirable leakage between the gate electrode and channel region. Also, carrier mobility in small channel regions of MOSFETs can be degraded by high dopant concentration. This, in turn, results in lower "on-current" for the transistor. Moreover, the parasitic series resistance of the source and drain regions increases with decreasing junction depth, which results in lower on-current for the transistor. Accordingly, approaches designed to reduce static power consumption can negatively affect overall device performance.

Another issue is dimensional variations which may affect sensitivity of device performance. For example, relatively small differences in gate length can result in significant performance differences. However, the manufacturing processes used to create devices are unable to provide device-to-device dimensional consistency required to render such performance differences negligible. Consequently, circuit designers must design for worst-case scenarios to accommodate the wide range of device performance levels, thereby sacrificing overall performance to accommodate manufacturability concerns.

Another issue in device performance variation results from geometrical irregularity. For example, sidewall gating at the edges of the active regions due to a slightly recessed device-isolation material (typically silicon dioxide) results in threshold-voltage variation with channel width. This is because the channel is turned on at a lower gate voltage at the edges. Also, stresses in the MOSFET channel region depend on channel width as well as the device layout pattern and density, resulting in undesirable variations in transistor on-state current.

Accordingly, there exists a need in the art to overcome the deficiencies and limitations described hereinabove.

SUMMARY

In a first aspect of the invention, a method comprises forming a gate structure on an active region and high-k dielectric material formed in one or more trenches adjacent to the active region. The method further comprises forming a sacrificial material over the active region and portions of the high-k dielectric material adjacent sidewalls of the active region. The method further comprises removing unprotected portions of the high-k dielectric material, leaving behind a liner of high-k dielectric material on the sidewalls of the active region. The method further comprises removing the sacrificial material and forming a raised source and drain region adjacent to sidewalls of the gate structure.

In another aspect of the invention, a method comprises forming an active region and high-k dielectric material on a substrate. The high-k dielectric material is adjacent sidewalls of the active region. The method further comprises forming a gate structure spanning over the active region and the high-k dielectric material. The method further comprises forming a sacrificial source and drain region on the active region, adjacent sidewalls of the gate structure. The forming of the sacrificial source and drain region further comprises forming an overlap region on the high-k dielectric material adjacent the sidewalls of the active region. The method further comprises forming a liner of high-k dielectric material on the sidewalls by removing exposed portions of the high-k dielectric material. The method further comprises forming a source drain region adjacent to the gate structure.

In yet another aspect of the invention, a structure comprises an active region formed on a substrate and a dual trench region formed adjacent to the active region. The dual trench region includes a high-k dielectric liner adjacent to sidewalls of the active region and a lower-k dielectric material adjacent to the high-k dielectric liner.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the device with a dual trench regions, which comprises the structures of the present invention. In still further embodiments, a method in a computer-aided design system is provided for generating a functional design model of the device with a dual trench regions. The method comprises generating a functional representation of the structural elements of the device with a dual trench regions.

More specifically, in aspects of the invention, a hardware description language (HDL) design structure is encoded on a machine-readable data storage medium. The HDL design structure comprises elements that when processed in a computer-aided design system generates a machine-executable representation of a structure with dual trench regions. The HDL design structure comprises: an active region formed on a substrate; and a dual trench region formed adjacent to the active region, wherein the dual trench region includes a high-k dielectric liner adjacent to sidewalls of the active region and a lower-k dielectric material adjacent to the high-k dielectric liner.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to semiconductor structures with dual trench isolation regions and methods of manufacturing the semiconductor structures. More specifically, the present invention provides a method of manufacturing semiconductor structures with trench isolation regions having different dielectric constant materials (or one material and an airgap). In embodiments, the trench isolation regions include a high-k dielectric liner, adjacent to an active material, e.g., source and drain regions, and a lower dielectric constant material adjacent to the high-k dielectric liner. In embodiments, the high-k dielectric material used for the liner can be replaced with a stress material, in subsequent processing steps. The lower dielectric constant material can be, for example, an airgap or a stress material.

In embodiments, the structures of the present invention are fabricated by forming a high-k dielectric material in a trench structure, around the source/drain regions (e.g., active region). By masking portions of the high-k dielectric material adjacent to the active region, it is possible to selectively remove, e.g., etch, unprotected material, thereby forming a high-k dielectric liner on the sidewall of the active region. The masking can be provided by a sacrificial raised source/drain region grown over the active region and adjacent portions of the high-k dielectric material. For example, the sacrificial raised source/drain region can be epitaxially grown on the active region, with a well controlled offset or overlap over the high-k dielectric material. By using the sacrificial raised source/drain region, it is possible to circumvent problems with etch selectivity between the high-k dielectric material and exposed Si regions. Also, the sacrificial raised source/drain region provides improved accuracy and repeatability to minimize device variation. The removed high-k dielectric material can then be replaced with a lower dielectric constant material to form trench isolation regions with different dielectric constants.

The present invention, advantageously, provides improvement in device performance over planar bulk MOSFETs without the need to resort to FinFET-like fabrication processes. For example, in embodiments, the drain fringing fields are reduced, thus increasing the MOSFET design space and performance.

Figure 1:
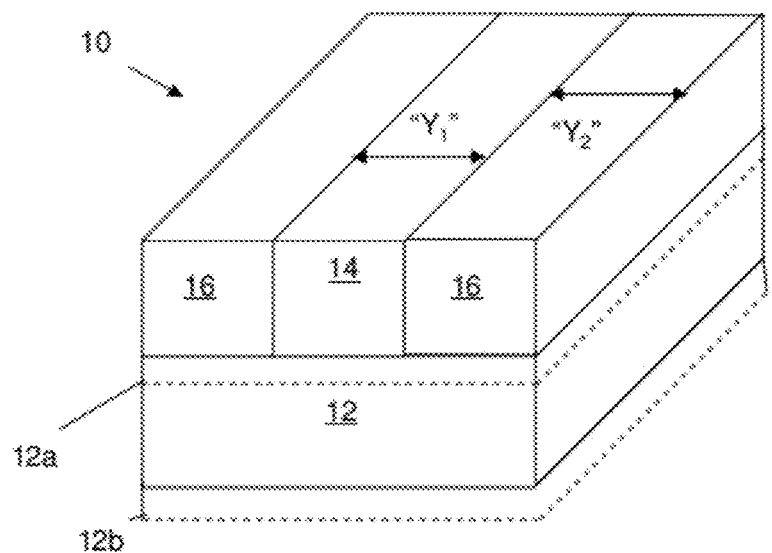
FIG. 1 shows a structure and respective processing steps in accordance with aspects of the present invention.

FIG. 1 shows a structure and respective processing steps in accordance with aspects of the present invention. More specifically, FIG. 1 shows a structure 10 comprising a substrate (generally depicted at reference numeral 12), active region 14 and isolation structures filled with a high-k dielectric material 16. In embodiments, the active region 14 can have an arbitrary width "$Y_1$", depending on the parameters of the resulting device. For example, the active region 14 can have a width "$Y_1$" of about 15 to 20 nm and more preferably about 18 nm; although, other dimensions are also contemplated by the present invention such as, for example, a width that equals a length of a gate formed over the active region 14. In embodiments, the width "$Y_2$" of the one or more trench structures (e.g., high-k dielectric material 16 within the one or more trench structure) is about 15 to 25 nm and more preferably about 20 nm to about 24 nm; although, other dimensions are also contemplated by the present invention. The thickness of the high-k dielectric material 16 within the trench may be about half the dimension of the width, "$Y_2$". In embodiments, the high-k dielectric material 16 can be any appropriate high-k dielectric material 16 such as, for example, a hafnium based material such as $HfO_2$. The high-k dielectric material 16 can also be other materials such as, for example, $AlO_2$, titanium dioxide, tantalum pentoxide or other metal oxides.

In embodiments, the substrate 12 can be an SOI or bulk wafer. For example, the substrate 12 can include a semiconductor layer (e.g., active silicon) 14 formed over an insulation layer 12a. The isolation region 12a can include, for example, junction isolation or an insulating layer (such as $SiO_2$) or junction isolation placed on top of an insulating layer. The isolation region 12a can be either a wafer handler or an insulating layer (assuming that insulation layer 12a either does not exist or is just a junction isolation region). In the SOI implementation, the isolation region may be referred to as a BOX layer, as represented by dashed line 12a. The constituent materials of the semiconductor layer (which forms the active region 14) may be selected based on the desired end use application of the semiconductor device. For example, the active region 14 may be comprised of various semiconductor materials, such as, for example, Si, SiGe, SiC, SiGeC, etc. Hereinafter, the substrate is shown generally as reference numeral 12; although, it should be understood that the substrate may include any of the constituent components described above.

The structure 10 of FIG. 1 can be formed using different processes. For example, in embodiments, the active region 14 can be formed (e.g., deposited) on the substrate 12, and patterned (etched) to form trench regions on opposing sides thereof. The patterning can be performed by, for example, a conventional photolithographic and reactive ion etching (RIE) process, known to those of skill in the art. The high-k material 16 can then be deposited in the trenches using conventional deposition processes such as, for example, chemical vapor deposition (CVD). The high-k material 16 can undergo a planarization process to form the structure 10 of FIG. 1. In embodiments, the planarization process can be, for example, a chemical mechanical process (CMP).

As an alternative processing approach, the structure 10 of FIG. 1 can be formed by depositing the high-k dielectric material 16 on the substrate 12 (e.g., insulator material 12a). The high-k dielectric material 16 then undergoes a patterning process using, for example, a conventional photolithographic and RIE process, to form a trench. The active region 14 can be formed (e.g., epitaxially grown) in the trench. In embodiments, a CMP may not be necessary in a well controlled epitaxial growth process; although, a CMP process can still be used when implementing non-well controlled growth processes or a deposition process such as, for example, a CVD process.

Figure 2:
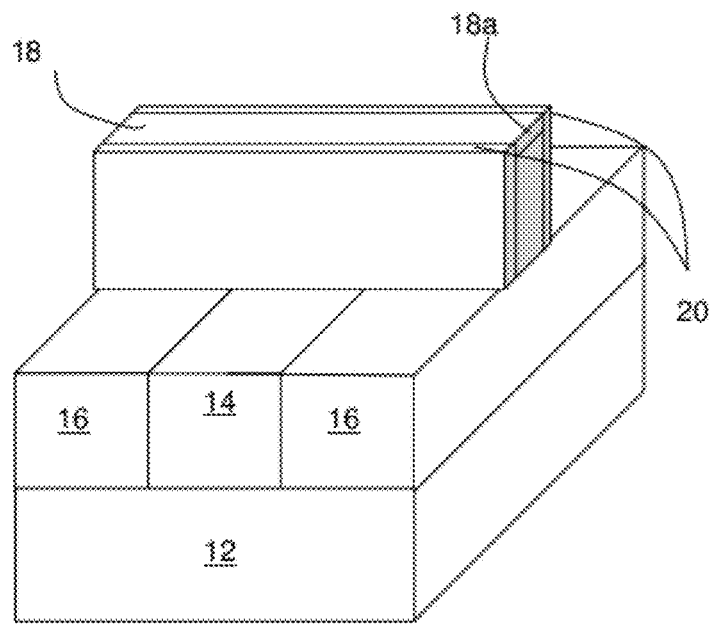
FIGS. 2-6 show processing steps and respective structures in accordance with aspects of the present invention, starting from the structure of FIG. 1.

FIG. 2 shows additional processing steps and respective structure in accordance with aspects of the present invention. More specifically, FIG. 2 shows the formation of a gate stack 18 and sidewall spacers 20. In embodiments, the gate stack 18 has a gate length of about below 30 nm; although, other gate dimensions are also contemplated by the present invention, depending on the required device requirements, e.g., 15 nm to 20 nm and more preferably about 18 nm. A height of the gate may be about 9 nm; although, other dimensions are also contemplated by the present invention. In embodiments, the gate stack 18 includes, for example, a high-k dielectric material or oxide material. In embodiments, the high-k dielectric material or oxide material can be about 2 nm to 3 nm in thickness; although, other dimensions are also contemplated by the present invention. For example, in embodiments, the high-k dielectric material or oxide material can be less than 2 nm in thickness. A gate material, e.g., poly or metal, can be formed on the high-k dielectric material or oxide material. The sidewall spacers 20 can be an oxide or a nitride material, for example, and can have a thickness of about 4 nm; although, other dimensions are also contemplated by the present invention. In alternative embodiments, the sidewall spacers 20 are tapered with a bottom of the taper (near the active region) being about 4 nm; although, other dimensions are also contemplated by the present invention.

The structure of FIG. 2 can be formed by conventional photolithographic and RIE processes. For example, the high-k dielectric material or oxide material is deposited on the active region 14 and the high-k dielectric material 16. The gate material is then formed (e.g., deposited) on the high-k dielectric material or oxide material. A photoresist is then formed on the gate material, and exposed to light to form a pattern. The exposed regions (e.g., unmasked regions) of the gate material and high-k dielectric material or oxide material are etched to form the gate structure 18. The photoresist is then removed using, for example, a conventional ashing process. The sidewall spacers 20 are deposited on the sidewalls of the gate structure 18. In embodiments, the material used to form the sidewall spacers 20 can also be used as an optional capping layer 18a of the gate structure 18. In embodiments, the sidewall spacers 20 (and capping layer 18a) can be formed from oxide or nitride, as non-limiting illustrative examples.

Figure 3:
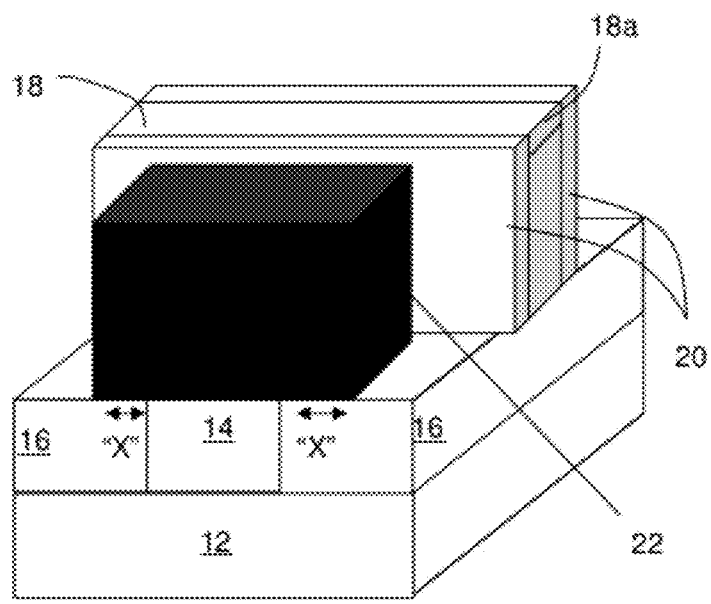

FIG. 3 shows additional processing steps and respective structure in accordance with aspects of the present invention. More specifically, in FIG. 3, a sacrificial raised source/drain region 22 is formed on the active region 14, adjacent to sidewall spacers 20 of the gate structure 18. In embodiments, the sacrificial raised source/drain region 22 is non-specific in terms of doping, thickness, and other parameters. As such, the sacrificial raised source/drain region 22 can be used for both an NFET and a PFET. In alternative embodiments, the sacrificial raised source/drain region 22 can be a doped silicon, SiC or SiGe material, depending on its particular application. Although the source/drain formation may take place at any point after the sidewall spacer formation, the sacrificial raised source/drain region 22 may be in-situ doped in order to additionally act as a diffusion source for source/drain dopants. In such a case, a dopant drive-in anneal would be performed prior to etch of the high-k dielectric material 16 to form a high-k dielectric liner.

In embodiments, the sacrificial raised source/drain region 22 is formed by an epitaxial growth process (which thus eliminates the need for a subsequent patterning process). It should be understood that the sacrificial raised source/drain region 22 is provided on both sides of the gate structure 18, preferably in contact with the sidewall spacers 20. In embodiments, the epitaxial growth of the sacrificial raised source/drain region 22 will provide an overgrowth or overlap "X" over the high-k material 16. The overlap "X" may vary depending on desired device performance and etching processing. For example, the overlap "X" may be about 4 nm to about 5 nm; although, other dimensions are also contemplated by the present invention.

In embodiments, the lateral overgrowth (e.g., overlap "X") of the sacrificial raised source/drain region 22 will shield the active region 14 from an HTI etch, e.g., etching of the high-k material 16. For example, as shown in FIG. 3 (and FIG. 4), the overlap "X" will shield the sidewall of the active region 14 from the HTI etch, thereby preventing etch damage along the sidewall of the active region 14 which would otherwise increase junction leakage around the perimeter of the source/drain regions.

Figure 4:
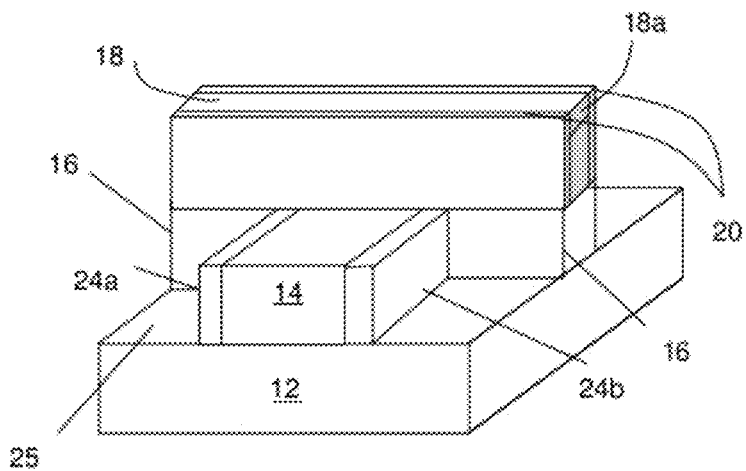

In FIG. 4, unmasked portions of the high-k dielectric material 16 are removed using, for example, an anisotropic RIE process (HTI etch). The removal of the high-k dielectric material 16 forms trenches 25 and liners 24a, 24b on the sidewalls of the active region 14. More specifically, in embodiments, the lateral overgrowth (e.g., overlap "X") of the sacrificial raised source/drain region 22 will shield the active region 14 and portions of the high-k dielectric 16 from the etching process resulting in HTI liner 24a, 24b formed on the source/drain sidewalls of the active region 14. The thickness of the HTI liners 24a, 24b can be well controlled by the dimensions of the lateral overgrowth "X". In embodiments, due to the etching, the liners 24a, 24b can be tapered, with a bottom of the taper (near the substrate) being about 4 nm; although, other dimensions are also contemplated by the present invention.

In this example, the high-k dielectric material (HTI) to sacrificial raised source/drain region (RSD) etch selectivity is 1:1; although, other selectivities are also contemplated by the present invention such as, for example, 3:1 or 5:1. By tailoring the sacrificial RSD thickness and HTI:Si etch selectivity, the optimal high-k dielectric material etch depth can be reached without recessing the Si in the source/drain regions.

As further shown in FIG. 4, the capping layer 18a of the gate structure 18 (and the sidewalls 20) protects the gate structure 18 during the HTI etching process. That is, the capping layer 18a prevents etching of the gate structure 18, while the combination of the capping layer 18a and the anisotropic etching ensures that portions of the high-k dielectric material 16 remain under the gate structure 18. The sacrificial raised source/drain region 22 can be removed using conventional processes. In embodiments, the sacrificial material (e.g., sacrificial raised source/drain region 22) may also be tuned such that it is of such a thickness (e.g., thick/thin enough) to be entirely etched away during the HTI etching process, which would obviate the need for an extra removal step after the HTI etching process.

Figure 5:
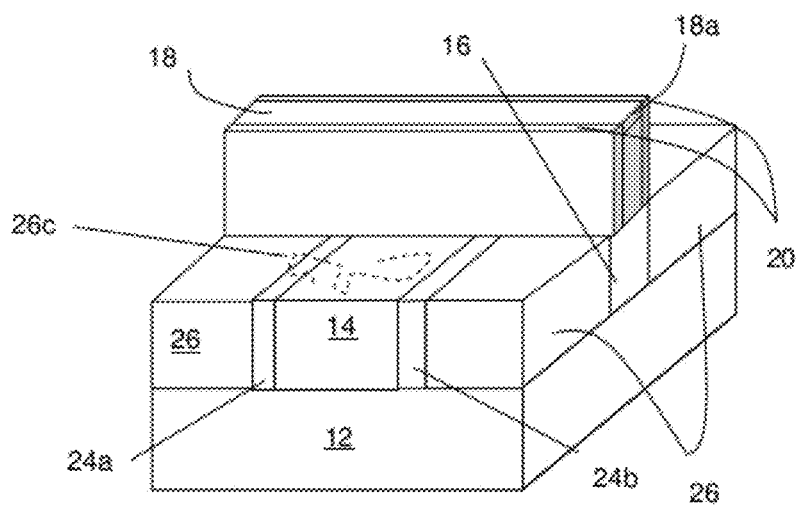

In FIG. 5, a material 26 is deposited within the trenches 25 (shown in FIG. 4), adjacent (e.g., in contact) to the remaining high-k dielectric material 16 and the HTI liners 24a, 24b. In embodiments, the material 26 is a lower k-dielectric layer. In embodiments, the material 26 can be a compressive or tensile material such as, for example, a nitride, which can also be optionally deposited on a top surface of the active region 14 shown by dashed line 26c. As should be understood by those of ordinary skill in the art, the stress material would have the added benefit of coupling more stress to the channel region since it wraps around the active region 14, as opposed to a conventional planar device whereby the stress liner only exists along the top surface. In further embodiments, the material 26 can be a diamond-like carbon. In further embodiments, reference numeral 26 can be representative of an airgap which can substantially decouple the source/drain sidewalls from the channel sidewall, leading to improved gate control.

Figure 6:
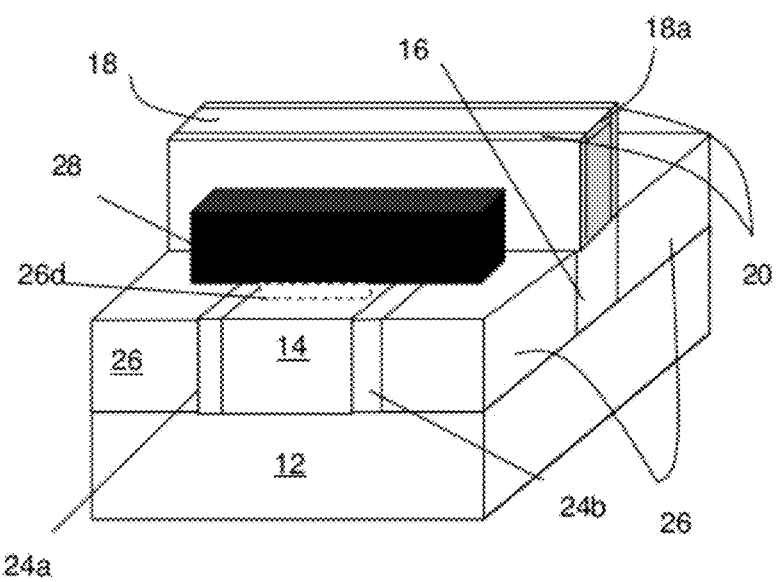

As shown in FIG. 6, a raised source drain region 28 can be formed over the active region 14 and, e.g., overlapping the HTI liners 24a, 24b and, in further embodiments, e.g., material 26. For example, an epitaxial growth process can be used to form the raised source drain region 28. The material used to form the raised source drain region 28 can be doped prior to formation, or doped or implanted after formation of the raised source drain region 28. The dopants and/or implants can be any conventional dopants or implants such as, for example, Arsenic or Phosphorous, and at any appropriate energy and concentration levels, depending desired NFET or PFET device performance. As should be understood by those of skill in the art, the raised source drain region 28 is provided on both sides of the gate structure 18.

FIG. 6 is also representative of additional processing steps such as, for example, the formation of stress material in the source and drain regions. More specifically, a recess can be formed in the active region, adjacent or within the source and drain regions, using a selective chemistry to the active region 14 and/or the HTI liners 24a, 24b and/or the material 26. The recess, when formed in the source/drain region of the active material, can be filled with a stress material such as, for example, SiGe or SiC. In the case that the recess is formed adjacent to the source/drain region, e.g., sidewalls of one either or both sides of the source/drain region, the recess can be filled, for example, with nitride, diamond-like carbon or other material that has a lattice mismatch with the material of the active region 14 (shown by dashed line 26d). Although any number of materials could be used as a compressive and tensile material, in embodiments, the recess adjacent to the sidewalls of the source/drain regions can be filled with a tensile (NMOS) or compressive (PMOS) silicon nitride. Advantageously, the silicon nitride has a relatively low temperature deposition (e.g., 1.6 GPa tensile and 2.0 GPa compressive nitride can be performed below about 600° C.-700° C.) as well as a relatively low dielectric constant (about 7.5) compared to the HTI regions (which may have a dielectric constant of about 20+). Thus, the use of tensile/compressive nitride as the dual trench material can serve to both reduce drain fringing field control over the HTI MOSFET and increase drive current due to strain.

Additionally, in embodiments, the HTI liners 24a, 24b can be stripped, leaving an airgap (also represented by reference numerals 24a, 24b) between the material 26 and the active region 14. In embodiments, the HTI liners 24a, 24b can be stripped using a selective etch process to the HTI liners 24a, 24b. The airgaps can also be filled with a stress material such as, for example, SiGe, SiC, etc. (also represented by reference numerals 24a, 24b). In embodiments, the airgaps can be filled with a insulating material such as, for example, a compressive or tensile nitride.

Figure 7:
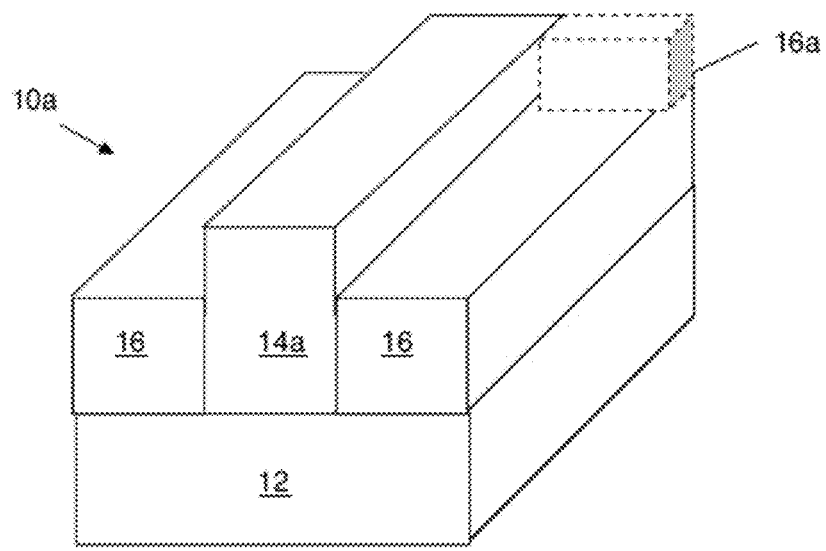
FIG. 7 shows an alternative structure and respective processing steps in accordance with aspects of the present invention.

FIG. 7 shows an alternative structure in accordance with aspects of the present invention. More specifically, the structure 10a of FIG. 7 includes a raised active region 14a. In embodiments, the raised active region 14a may be formed by blanket depositing high-k dielectric material 16 on the substrate 12. In embodiments, the substrate 12 can be any of the substrates as discussed with reference to FIG. 1. A capping material 16a, e.g., nitride, is formed, e.g., deposited, on the high-k dielectric material 16.

The high-k dielectric material 16 and capping material 16a then undergo a patterning process using, for example, a conventional photolithographic and RIE process, to form a trench. The active material can be formed (e.g., epitaxially grown) in the trench, to a height of the capping material 16a. In embodiments, the active material can be silicon, for example; although, other materials are contemplated by the present invention as described above. The capping material 16a is then removed (as partially shown in FIG. 7) using a conventional etching process, selective to the capping material. The removal of the capping material will form the raised active region 14a (with respect to a height of the high-k dielectric material 16).

Figure 8:
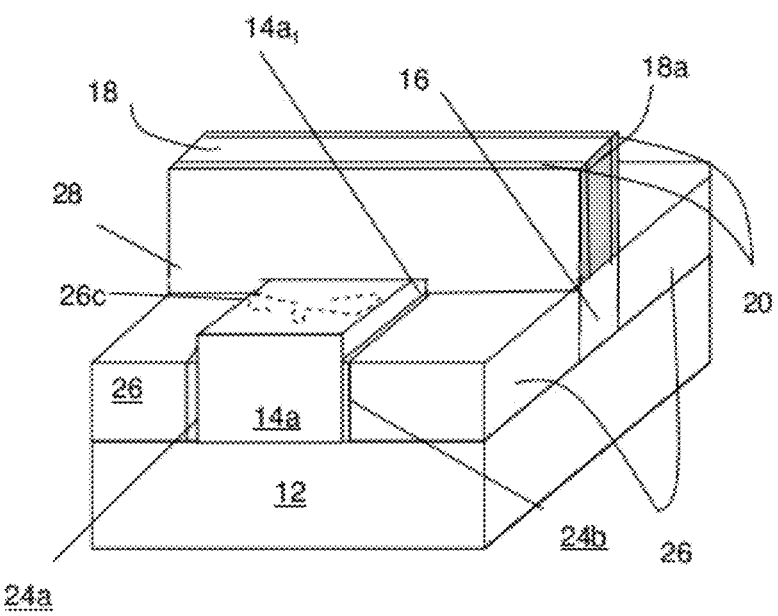
FIGS. 8 and 9 show processing steps and respective structures in accordance with aspects of the present invention, starting from the structure of FIG. 7.

Referring to FIG. 8, similar to the processes described in FIG. 2, a gate stack 18 and sidewall spacers 20 are formed on the structure 10a. More specifically, a high-k dielectric material or oxide material is deposited on the raised active region 14a and the high-k dielectric material 16. The gate material is then formed (e.g., deposited) on the high-k dielectric material or oxide material. The gate material and high-k dielectric material or oxide material is then patterned to form the gate structure 18. The sidewall spacers 20 are deposited on the sidewalls of the gate structure 18. In embodiments, the material used to form the sidewall spacers 20 can also be used as an optional capping layer 18a of the gate structure 18, e.g., oxide or nitride. In this aspect of the invention, the gate structure 18 and sidewall spacers 20 will straddle over edges $14a_1$ of the raised active region 14a.

Similar to the processes described in FIG. 3, a sacrificial raised source/drain region is formed on the raised active region 14a, adjacent to sidewall spacers 20 of the gate structure 18. In embodiments, the sacrificial raised source/drain region can be non-specific in terms of doping, thickness, and other parameters, or can be tailored for specific devices. In embodiments, the sacrificial raised source/drain region is formed by an epitaxial growth process on the raised active region 14a, on both sides of the gate structure 18 (preferably in contact with the sidewall spacers 20). In embodiments, the epitaxial growth of the sacrificial raised source/drain region will provide an overgrowth or overlap over the high-k material, which may vary depending on device performance and etching processing, e.g., about 5 nm; although, other dimensions are also contemplated by the present invention.

Similar to the processes described in FIG. 4, unmasked portions of the high-k dielectric material are removed using, for example, an anisotropic RIE process (HTI etch). The removal of the high-k dielectric material forms the HTI liners 24a, 24b and trenches, which are subsequently filled with material 26. In embodiments, the HTI liners 24a, 24b have a thickness on the order of the lateral overgrowth of the sacrificial raised source/drain region. In this example, the high-k dielectric (HTI) to sacrificial raised source/drain region (RSD) etch selectivity is 1:1; although, other selectivities are also contemplated by the present invention such as, for example, 3:1 or 5:1. For example, a 3:1 selectivity may be obtained using a non-limiting illustrative example of a 14 nm node geometry (e.g., active pitch=42 nm, gate pitch=56 nm, and scale 20LP device dimensions by 0.7).

In embodiments, the capping layer 18a of the gate structure 18 (and the sidewalls 20) protects the gate structure 18 during the etching process. That is, the capping layer 18a prevents etching of the gate structure 18, while the combination of the capping layer 18a and the anisotropic etching ensures that portions of the high-k dielectric material 16 remain under the gate structure 18. The sacrificial raised source/drain region can be removed using conventional processes.

Similar to the processes described in FIG. 5, material 26 is deposited within the trenches, adjacent (e.g., in contact) to the HTI liners 24a, 24b and the high-k dielectric material 16. In embodiments, the material 26 is a lower k-dielectric layer (compared to the HTI liners 24a, 24b), which can be deposited to any desired height, e.g., deposited to a height lower than the HTI liners 24a, 24b. For example, the height of the material 26 may be any height, as the height of the material 26 can be subject to optimizing the trade-off between parasitic resistance and capacitance. More specifically, at a height lower than the HTI liners 24a, 24b, a subsequent epitaxial growth over the source/drain can overgrow over the HTI liners 24a, 24b (e.g., FIG. 9), which would provide more surface area to form a contact, at the cost of extra parasitic capacitance between the overgrown epitaxial region and the gate 18. On the other hand, if the material 26 is the same height as the HTI liners 24a, 24b, then the epitaxial layer will be planar (or close to it), which means less contact area but also, potentially, less parasitic capacitance.

In embodiments, the material 26 can be a compressive or tensile material such as, for example, a nitride, which is deposited in the trenches and, in optional embodiments, along a top surface of the active region shown by dashed line 26c. As described above, the stress material has the added benefit of coupling more stress to the channel region since it wraps around the active region 14, as opposed to a conventional planar device whereby the stress liner only exists along the top surface. In further embodiments, the material 26 can be a diamond-like carbon or an airgap which can substantially decouple the source/drain sidewalls from the channel sidewall, leading to improved gate control.

Figure 9:
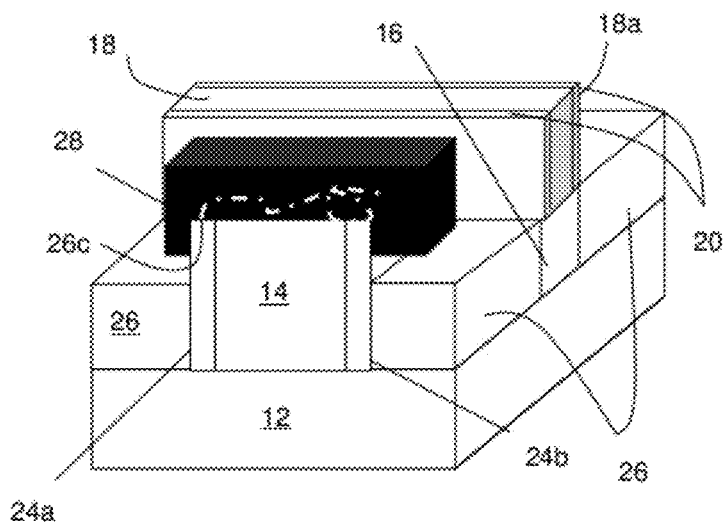

In FIG. 9, a raised source drain region 28 is formed by an epitaxial growth process over the active region 14a and, e.g., overlapping the HTI liners 24a, 24b and, in further embodiments, e.g., material 26. As should be understood by those of skill in the art, the raised source drain region 28 is provided on both sides of the gate structure 18. The material forming the raised source drain region 28 can be doped prior to formation, or doped or implanted after formation, with conventional dopants, energy levels and concentrations as discussed above, in order to achieve desired device performance.

FIG. 9 is also representative of additional processing steps such as, for example, the formation of stress material in the source and drain regions. More specifically, a recess can be formed in the active region, adjacent or within the source and drain regions, using a selective chemistry to the active region 14a and/or the HTI liners 24a, 24b and/or the material 26. The recess can then be filled with a stress material such as, for example, SiGe, SiC or other material that has a lattice mismatch with the material of the active region 14a. Additionally, in embodiments, the HTI liners 24a, 24b can be stripped, using a selective etch process to the HTI liners 24a, 24b, leaving an airgap (represented by reference numerals 24a, 24b) between the material 26 and the active region 14. The airgaps can also be filled with a stress material such as, for example, SiGe, SiC, etc. (also represented by reference numerals 24a, 24b). In embodiments, the airgaps can be filled with a insulating material such as, for example, a compressive or tensile nitride.

Figure 10A:
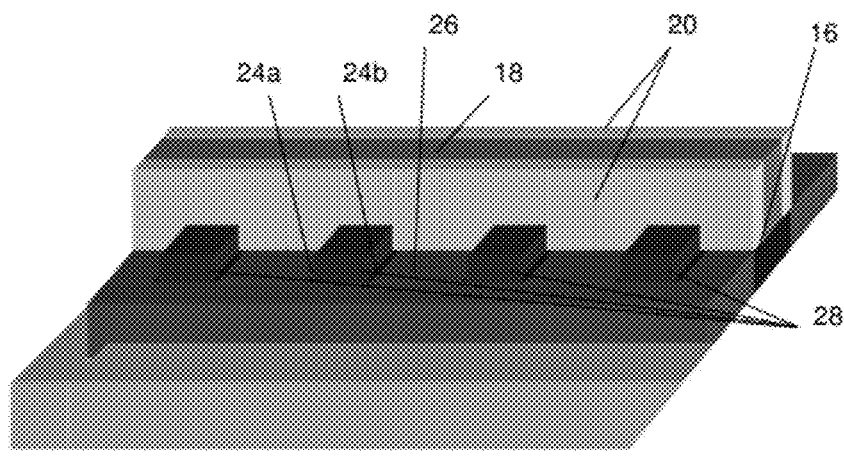
FIG. 10a is a perspective view of the structure of FIG. 6 or FIG. 9 in accordance with aspects of the invention.

FIG. 10a is a perspective view of the structure of FIG. 6 or FIG. 9 in accordance with aspects of the invention. More specifically, the structure of FIG. 10a shows the gate structure 18 and sidewall spacers 20 extending over the high-k dielectric material 16, across an entire span of the structure. Along the span are a plurality of raised source and drain regions 28. Liners 24a, 24b of the high-k dielectric material is provided at each of the plurality of raised source and drain regions 28. The lower-k dielectric material 26 surrounds the liners 24a, 24b. As such, it is possible to fabricate several devices simultaneously using the processes of the present invention.

Figure 10B:
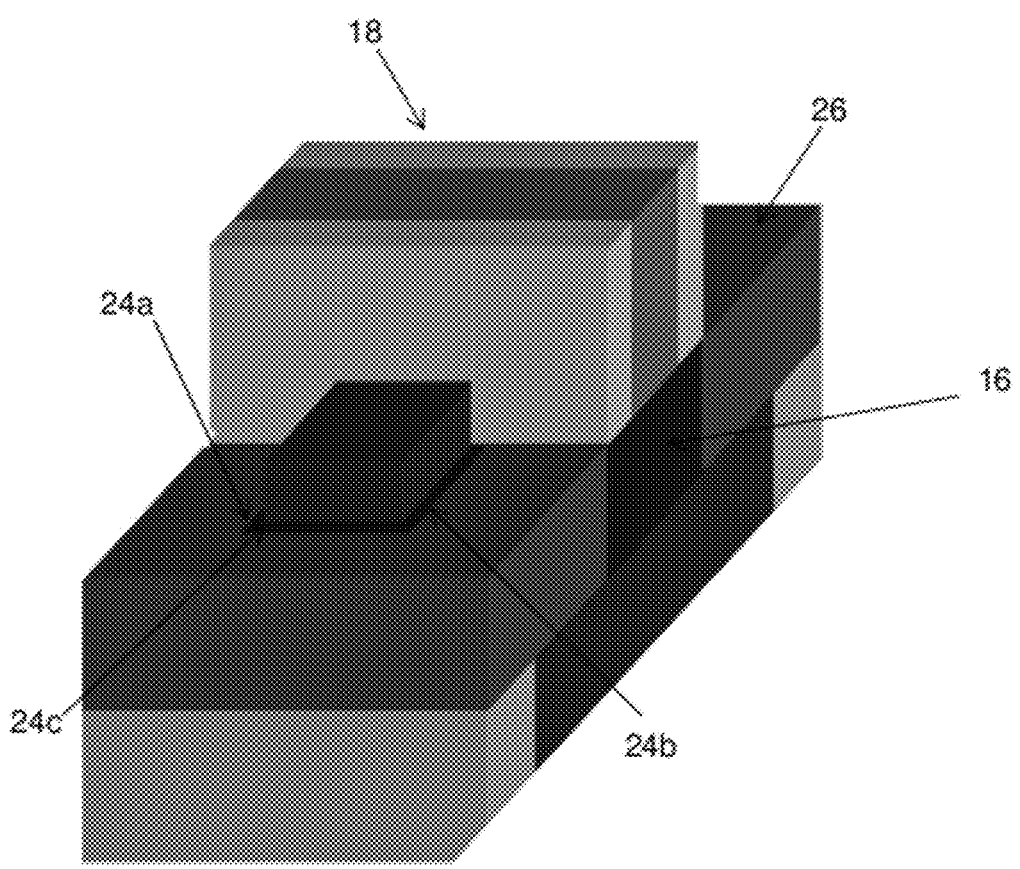
FIG. 10b is a perspective view of the structure with an high-k dielectric liner at an end of a source/drain region in accordance with aspects of the invention.

In additional embodiments, the HTI liners can surround both sidewalls of the source/drain regions, as well as the end of the source/drain regions. This configuration depends on the original geometry of the HTI region. For example, as shown in FIG. 10b, by patterning HTI stripes which originally extend into the global isolation regions, then the final structure will not have an HTI liner along the ends of the source/drain regions (as FIGS. 1-10a); however, it is also contemplated to pattern trenches within an HTI pad, such that the edges of these trenches (e.g., in the length direction, into and out of the page for the structure shown in FIG. 10b) fall within the active region, then the source/drain ends will have an HTI liner 24c.

Figure 11:
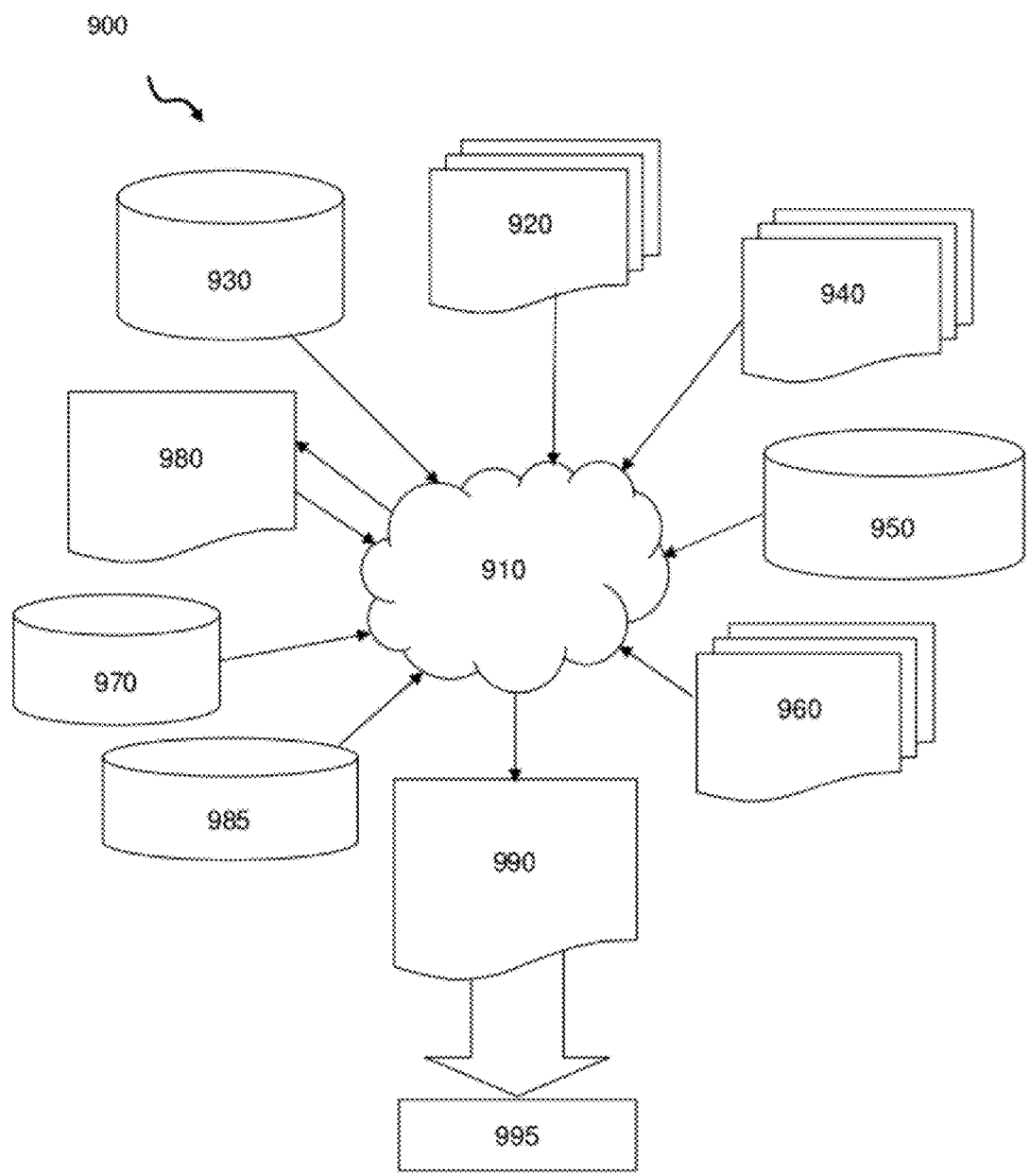
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10b. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10*b*. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10*b* to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10*b*. In one embodiment, design structure 990 may comprise a compiled, executable HDL simulation model that functionally simulates the devices shown in FIGS. 1-10*b*.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10*b*. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
    forming a gate structure on an active region and high-k dielectric material formed in one or more trenches adjacent to the active region;
    forming a sacrificial material over the active region and portions of the high-k dielectric material adjacent sidewalls of the active region;
    removing unprotected portions of the high-k dielectric material, leaving behind a liner of high-k dielectric material on the sidewalls of the active region;
    removing the sacrificial material; and
    forming a raised source and drain region adjacent to sidewalls of the gate structure.

2. The method of claim 1, wherein the forming the sacrificial material comprises epitaxially growing the sacrificial material on the active region, with an overlap on the portions of the high-k dielectric material adjacent sidewalls of the active region.

3. The method of claim 2, wherein the sacrificial material is a sacrificial source/drain region.

4. The method of claim 2, wherein a thickness of the liner of the high-k dielectric material is substantially equivalent to the overlap.

5. The method of claim 1, further comprising forming a low-k dielectric material in trenches formed by the removing step.

6. The method of claim 5, wherein the low-k dielectric material is a stress material.

7. The method of claim 5, wherein the low-k dielectric material is an airgap formed by the removing of the unprotected portions of the high-k dielectric material.

8. The method of claim 1, wherein the active region is a raised region with respect to the high-k dielectric material.

9. The method of claim 8, wherein the raised active region is formed by:
    depositing the high-k dielectric material on a substrate;
    depositing a capping material on the high-k dielectric material;
    patterning the high-k dielectric material and the capping material to form a trench;
    forming material in the trench to a height of the capping material; and
    removing the capping material to form the raised active region.

10. The method of claim 1, wherein the gate structure is formed by:
    forming a high-k dielectric layer or oxide material on a substrate;
    depositing a gate material on the high-k dielectric layer or oxide material;
    patterning the high-k dielectric layer or oxide material and the gate material;
    forming sidewall spacers on sides of the patterned gate material; and
    forming a capping layer on a top surface of the patterned high-k dielectric layer or oxide material and gate material, wherein the capping layer and sidewall spacers protect the gate structure during the removing of the unprotected portions of the high-k dielectric material.

11. The method of claim 1, wherein the removing is an etching process, wherein the etching process is selectively tailored to remove the unprotected portions of the high-k dielectric material.

12. The method of claim 11, wherein the selectively tailoring comprises tailoring a thickness of the sacrificial material and high-k dielectric material to semiconductor material etch selectivity to achieve a desired etch depth, without recessing the active region in source and drain regions.

13. A method, comprising:
    forming an active region and high-k dielectric material on a substrate, wherein the high-k dielectric material is adjacent sidewalls of the active region;
    forming a gate structure spanning over the active region and the high-k dielectric material;
    forming a sacrificial source and drain region on the active region, adjacent sidewalls of the gate structure, the forming of the sacrificial source and drain region further comprising forming an overlap region on the high-k dielectric material adjacent the sidewalls of the active region;
    forming a liner of high-k dielectric material on the sidewalls by removing exposed portions of the high-k dielectric material; and
    forming a source drain region adjacent to the gate structure.

14. The method of claim 13, wherein the forming of the sacrificial source and drain region is an epitaxial growth of a semiconductor material which forms the overlap region on the high-k dielectric material.

15. The method of claim 13, wherein the forming of the active region includes forming a raised active region by forming a cap material on the high-k dielectric material, forming a trench in the high-k dielectric material and cap material, forming Si material in the trench, and removing the cap material.

16. The method of claim 13, further comprising forming a recess in source and drain regions and filling the recess with a stress material.

17. The method of claim 13, further comprising removing the liner of high-k dielectric material to form a trench.

18. The method of claim 17, further comprising placing a compressive or tensile material in the trench formed by the removing of the liner of high-k dielectric material.

19. The method of claim 13, further comprising forming a low-k dielectric adjacent to the liner.

20. A structure, comprising:
    an active region formed on a substrate; and
    a dual trench region formed adjacent to the active region, wherein the dual trench region includes a high-k dielectric liner adjacent to sidewalls of the active region and extends directly onto the substrate and a lower-k dielectric material adjacent to the high-k dielectric liner and directly on the substrate.

21. The structure of claim 20, wherein the active region is a raised active region.

22. The structure of claim 20, further comprising a gate structure spanning the active region and provided over high-k dielectric material that also forms the liner.

23. A hardware description language (HDL) design structure encoded on a machine-readable data storage medium, the HDL design structure comprising elements that when processed in a computer-aided design system generates a machine-executable representation of a device with dual trench regions, wherein the HDL design structure comprises:
  an active region formed on a substrate;
  a dual trench region formed adjacent to the active region, wherein the dual trench region includes a high-k dielectric liner adjacent to sidewalls of the active region and a lower-k dielectric material adjacent to the high-k dielectric liner; and
  a raised source and drain region provided over the active region, the high-k dielectric material and the lower-k dielectric material.

24. The design structure of claim 23, wherein the design structure comprises a netlist.

25. The design structure of claim 23, wherein the design structure one of: resides on storage medium as a data format used for the exchange of layout data of integrated circuits and in a programmable gate array.

26. A structure, comprising:
  an active region formed on a substrate; and
  a dual trench region formed adjacent to the active region, wherein the dual trench region includes a high-k dielectric liner adjacent to sidewalls of the active region and a lower-k dielectric material adjacent to the high-k dielectric liner and directly on the substrate; and
  a raised source and drain region provided over the active region, the high-k dielectric material and the lower-k dielectric material.

27. The structure of claim 20, wherein the lower-k dielectric material is a stress material.

28. The design structure of claim 23, wherein the lower-k dielectric material is directly on the substrate.

29. The design structure of claim 23, wherein the lower-k dielectric material is a stress material.

\* \* \* \* \*